United States Patent [19]

Fang et al.

[11] 4,447,746
[45] May 8, 1984

[54] DIGITAL PHOTODETECTORS

[75] Inventors: Frank F. Fang, Yorktown Heights; James C. McGroddy, Briarcliff Manor, both of N.Y.

[73] Assignee: International Business Machines Corporation, Armonk, N.Y.

[21] Appl. No.: 336,490

[22] Filed: Dec. 31, 1981

[51] Int. Cl.³ .................... H03K 17/687; H03K 3/42
[52] U.S. Cl. .................................. 307/311; 307/580; 307/581
[58] Field of Search ............... 307/580, 308, 581, 574, 307/311; 328/2; 250/211 J

[56] References Cited

U.S. PATENT DOCUMENTS

| Re. 27,867 | 1/1974 | Years | 95/10 C |
|---|---|---|---|
| 3,582,220 | 6/1971 | Nobusawa | 356/226 |
| 3,590,153 | 6/1971 | Minowa | 178/7.1 |
| 3,619,665 | 11/1971 | Kosonocky | 307/279 |
| 3,624,419 | 11/1971 | Kosonocky | 307/279 |
| 3,631,411 | 12/1971 | Kosonocky | 340/173 LS |
| 3,742,830 | 7/1973 | Matsuzaki et al. | 95/10 CT |
| 3,748,498 | 7/1973 | Hoffmann | 307/279 |
| 3,770,967 | 11/1973 | Hanna et al. | 250/214 R |
| 3,770,968 | 11/1973 | Hession et al. | 250/214 R |
| 3,870,901 | 3/1975 | Smith et al. | 307/238 |
| 3,891,936 | 6/1975 | Romeo et al. | 330/28 |
| 3,983,420 | 9/1976 | Kikuchi | 307/279 |
| 4,004,170 | 1/1977 | Henke | 307/279 |
| 4,011,471 | 3/1977 | Rockett, Jr. | 307/308 |
| 4,019,070 | 4/1977 | Sakaguchi et al. | 307/279 |
| 4,023,048 | 5/1977 | Tompkins | 307/246 |
| 4,023,122 | 5/1977 | Oura | 331/111 |
| 4,045,817 | 8/1977 | Nakatani et al. | 358/213 |
| 4,065,668 | 12/1977 | Monticelli | 250/214 P |
| 4,145,721 | 3/1979 | Beaudouin et al. | 358/213 |

*Primary Examiner*—Stanley D. Miller
*Assistant Examiner*—B. P. Davis
*Attorney, Agent, or Firm*—Alvin J. Riddles

[57] ABSTRACT

A digital photodetector circuit having a photosensing stage connected to a depletion mode field effect transistor forming an inverter stage, increased sensitivity is achieved by then coupling the output of the photo inverter to a second photo inverter whose photosensitive element serves as the active load of an enhancement mode field effect transistor in the inverter stage. The circuit is readily fabricated in integrated structures. The circuit performance may be adjusted for responsiveness to light sensitivity and to provide selectable electrical output signal level and impedance matching including bistable performance.

12 Claims, 10 Drawing Figures

LIGHT IN $I_L$
$V_2$ $I_{TH_2}$  $I_{TH_1}$
LIGHT IN $I_L$

DIGITAL PHOTODETECTORS

DESCRIPTION

1. Technical Field

The technical field of the invention is the conversion of optical signals to digital form. In circuits of this type, it is necessary to sense the optical signal and then circuitry is required to provide sufficient digital integrity along with matching capability to drive the responding circuits.

A photodetector circuit generally must provide the necessary power gain since very little power is transferred in the optical signal.

2. Background Art

The most popular way in the art of converting optical signals to digital signals is to have the optical signal drive an Eccles-Jordan type flip-flop. This is shown in U.S. Pat. Nos. 3,619,665, 3,631,411 and 3,624,419.

In such approaches, the digital signal is precise but the response rate has limits. The bistability in the output driver is of advantage for precision in digital signals.

However, the standard flip-flop introduces complexity in fabrication and switching time delays. There have been some approaches in the art to provide photosensitive circuits that do not involve flip-flops.

In U.S. Pat. No. 3,770,968 a photosensing stage is employed to drive an inverter type stage for low light threshold purposes.

In U.S. Pat. No. 4,065,668 a photosensitive member and an FET are placed in series to provide linearity to an amplifier.

There is still however a need in the art for a photosensitive circuit with a digital output that as a unit provides bistability, power gain and impedance matching capabilities.

DISCLOSURE OF THE INVENTION

A digital photodetector technique is provided that incorporates photoresponsiveness into a source follower-inverter type of circuit to provide a defined binary output electric signal in response to a selectable optical signal strength and threshold.

Figure 1:
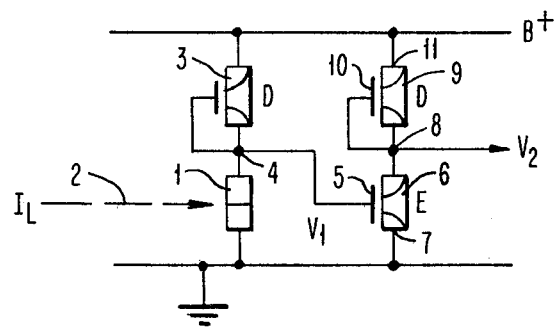
FIG. 1 is a single photosensitive element circuit of the invention.

Referring to FIG. 1, there is provided a schematic illustration of the optical-digital detector of the invention. A photoresponsive section of the circuit is a source-follower type of circuit stage having as one branch a photodetecting element 1 which may be any photosensitive device such as a photoconductor, a PIN diode or a phototransistor having a high dark resistance. The photodetector 1 is shown receiving input light 2 and has one electrode thereof connected to ground. The second electrode of element 1 is connected through a depletion mode field effect transistor (FET) 3 having the gate thereof connected to the source electrode thereof in the standard source-follower type circuit method and having the drain electrode thereof connected to drive a voltage (B+).

In accordance with standard convention in the art, depletion mode FET transistors, which have different conduction threshold from enhancement mode transistors, are labelled D and E, respectively. An enhancement mode FET (E) may be rendered completely non-conductive when the gate to source voltage is equal or less than zero or "normally off".

The circuit point or node at the output of the light sensitive element 1 and the source electrode of the load field effect transistor 3 is labelled 4.

The signal from node 4 is labelled $V_1$ and is connected to the gate electrode 5 of an enhancement mode FET transistor 6. The source elecrode 7 of transistor 6 is connected to ground and the drain electrode thereof is connected to an output circuit node 8. The node 8 in turn is connected to the source electrode of a depletion mode type FET transistor 9, the gate 10 of which is also connected to the node 8. The drain electrode 11 of transistor 9 is connected to the drive voltage (B+).

The output signal labelled $V_2$ is taken from the node 8.

In operation, in the absence of an optical signal 2, the device 1 is non-conducting or "off" and the device 3 is conducting or "on". This causes the $V_1$ signal at the node 4 to assume the level of the B+ voltage.

In turn, this condition appears at gate 5 which places the transistor 6 in the output inverter stage fully conductive or "on" while the depletion mode FET device 9 controls the current so that the output $V_2$ at node 8 is near zero or ground potential.

When the optical signal 2 changes conduction of the device 1, a photocurrent changes the voltage level at node 4 and in turn gate 5 which changes the conduction of device 6 thereby switching the output at node 8 to the equivalent of the drive voltage (B+).

The switching of the photoresponsive stage and the enhancement depletion inverter are extremely fast and non-linear when high performance FET devices are used.

Figure 2:
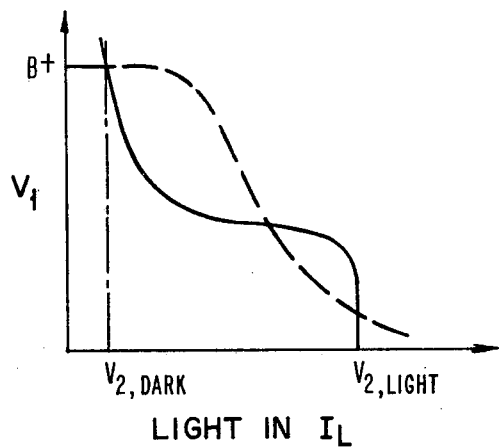
FIGS. 2 and 3 are graphs of the switching characteristics of the circuit of FIG. 1.
Figure 3:
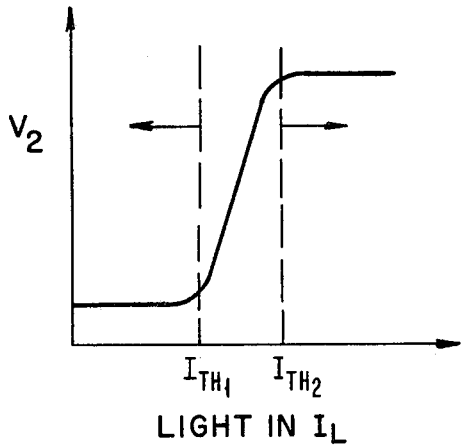

The operational input/output transfer characteristics of the circuit of FIG. 1 may be seen by referring to the graphs of FIGS. 2 and 3.

Referring to FIG. 2, there is shown an operating characteristic graph of the circuit of FIG. 1. There are two quasi monostable states associated respectively with dark and light conditions. FIG. 2 shows the transfer characteristics of the signal $V_1$ versus input light as a dashed curve and of the signal $V_2$ versus $V_1$ as a solid curve.

In FIG. 3 there is shown an operating characteristic graph of light input $I_L$ versus resulting voltage output $V_2$ which illustrates the switching thresholds $I_{TH1}$ and $I_{TH2}$. The threshold of the two quasi monostable states of the circuit is the region between the dashed lines. These states can be fine-tuned by selecting the threshold voltages of the field effect transistors in the usual manner well known in the art.

In accordance with the invention, the advantages may be further enhanced by the use of light responsive members in a push-pull relationship as set forth in connection with FIG. 4.

Figure 4:
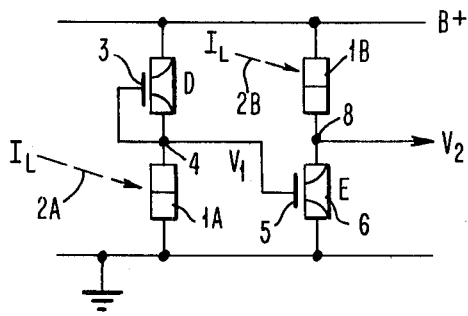
FIG. 4 is a two photosensitive element circuit of the invention.

Referring to FIG. 4, the circuit is similar to that of FIG. 1 except that the depletion mode FET 9 in the output stage is replaced by a second light sensitive element 1B. Thus, in FIG. 4 the light sensitive elements are labelled elements 1A and 1B and the sources of light are labelled elements 2A and 2B.

In the circuit of FIG. 4, the two photosensitive members operate in complementary fashion. The stage involving light element 1A operates identically to that shown in FIG. 1. In the second stage involving light element 1B, however, the optically produced current flow through the optical signal responsive member 1B increases conduction and changes the output level at node 8.

In operation, in the absence of an optical signal at either 2A or 2B, both devices 1A and 1B are non-conductive. Under these conditions, the enhancement FET device 6 is "on" because the node 4 is at B+. The $V_2$ output at node 8 is essentially at zero or ground. Upon the presence of an optical signal at both 2A and 2B, the sensing devices 1A and 1B are both turned on and produce photo current. This results in a push-pull effect on the circuit and the signal at the output $V_2$ rapidly approaches B+.

The switching operations are monostable and exhibit a fast digital pulse detection at a defined threshold.

Figure 5:
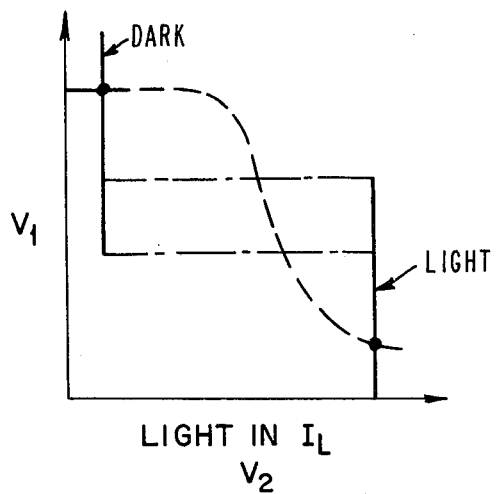
FIGS. 5 and 6 are graphs of the switching characteristics of the circuit of FIG. 4.
Figure 6:
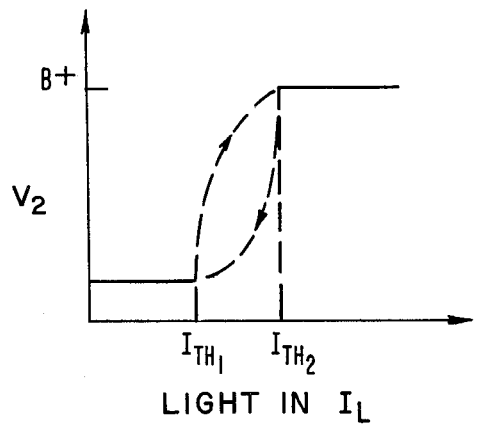

The operational characteristic graphs of the circuit of FIG. 4 are shown in connection with FIGS. 5 and 6. In FIG. 5, $V_1$ versus $I_L$ is the dashed curve whereas $V_2$ versus $V_1$ performance segments are the solid lines with the dot-dash connectors.

In FIG. 6 there is plotted light input $I_L$ and voltage output $V_2$ characteristics illustrating the two thresholds $I_{TH1}$ and $I_{TH2}$. The two monostable states associated with light signal conditions are illustrated and the switching is complete from both directions, dark to light and vice versa at the respective threshold $I_{TH1}$ and $I_{TH2}$. The window of switching between thresholds can be fine tuned by the threshold of the FETs. For instance, $I_{TH1}$ and $I_{TH2}$ can be made closer to each other by adjusting threshold voltages for both the enhancement and depletion FET devices.

Figure 7:
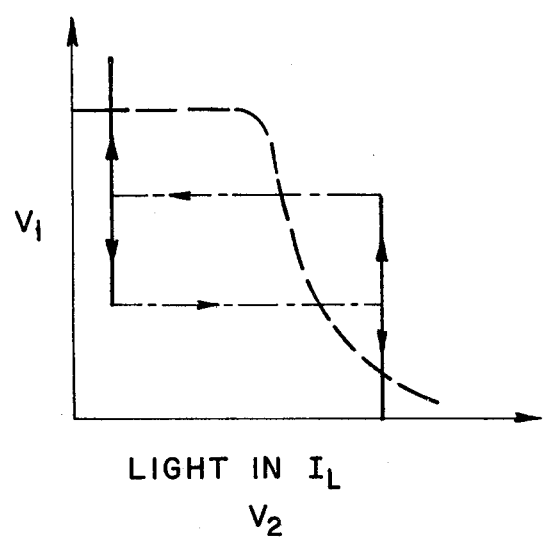
FIGS. 7 and 8 are graphs illustrating the hysteretic switching behavior of the circuits of the invention.
Figure 8:
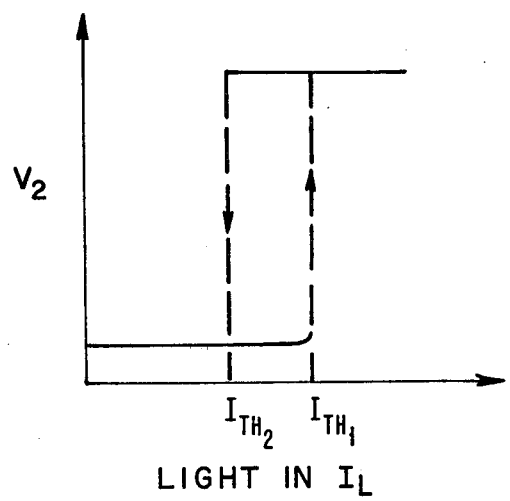

Referring next to FIGS. 7 and 8, the circuit operation graphs or transfer characteristics of quasi bistable switching and the light input versus voltage output characteristics are shown.

Referring to FIG. 7 a graph is shown of the quasi bistable switching of the circuit of FIG. 4 wherein $V_1$ versus $I_L$ is shown as the dashed curve and $V_2$ versus $V_1$ is shown as the solid line with the dashed connectors.

In FIG. 8 there is plotted light input versus voltage output for quasi bistable switching and here it is shown that the threshold current values for the respective conditions $I_{TH1}$ and $I_{TH2}$ overlap illustrating hysteretic switching behavior. The capability when properly tuned for narrow switching windows permits the device to serve as a binary digitizer.

The circuit of the invention has several capabilities that result in advantages. The nonlinearity of the inverter circuit type transfer characteristics which provide threshold switching and binary signal definition to the circuit also provides power gain right at the sensing stage. These capabilities provide the advantage of a high signal-to-noise ratio. A high electric field is always present at the optical sensing elements when they are dark so that small optically generated carrier transit times are encountered during the critical turn-on and turn-off parts of the switching. This provides the advantage of fast detection of optical pulse signals and provides precision of the digital output.

The optical signal detectors can be either photoconductors, photodiodes or phototransistors. The output signal level is determined by the B+ voltage level.

BEST MODE FOR CARRYING OUT THE INVENTION

The principles of the invention are preferably embodied in an integrated solid state structure wherein the FET transistors and optical signal detectors are extrinsic regions in an intrinsic portion of a monolithic semiconductor body.

Figure 9:
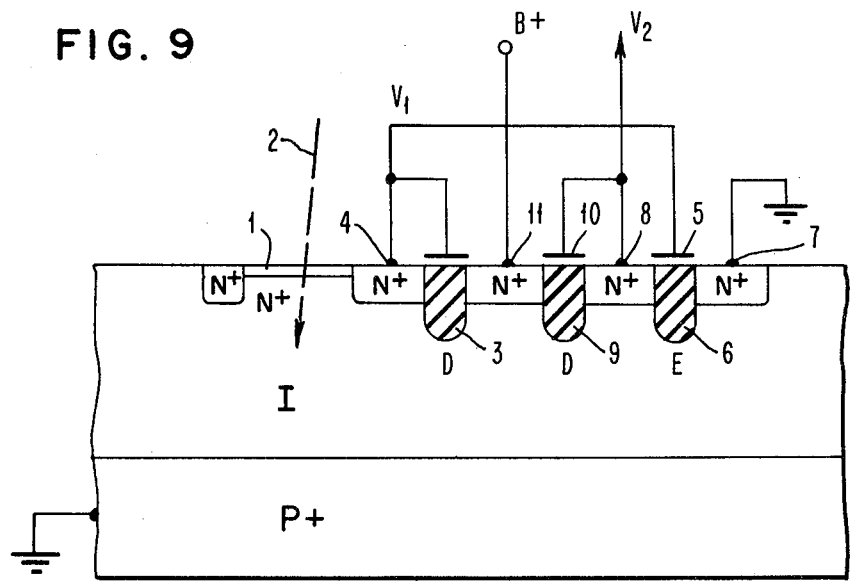
FIG. 9 is a solid state illustration of the circuit of FIG. 1.

In FIG. 9, an integrated structure is provided containing the capabilities of the circuit of FIG. 1 and employing the same reference numerals.

Referring to FIGS. 1 and 9, the optical signal detector 1 is the N+I P+ diode. Three FET transistors are provided, the two depletion FET's 3 and 9 are labelled D and the enhancement FET is labelled E. The two depletion devices D, which are normally on, are formed by phosphorus implantations of the channels standard in the art.

The enhancement FET E, which is normally off, is formed by boron implantation of the channel standard in the art.

The structure of FIG. 9 is fabricated by starting, for example, with a p+-type silicon wafer on which an intrinsic (I) region is epitaxially grown. The N+ source/drain regions are diffused as well as the contact ring region for the PIN diode. Three regions will next be implanted with suitable dopant, dosage and energy to form shallow N+ for the PIN diode, lightly N region for the depletion FETs 3 and 9, and lightly P region for the enhancement FET device 6. It is possible to have the N+ contact region and shallow N+ region for the PIN diode structure done in the same process step provided the N+ region for the source and drain contacts are sufficiently shallow.

Figure 10:
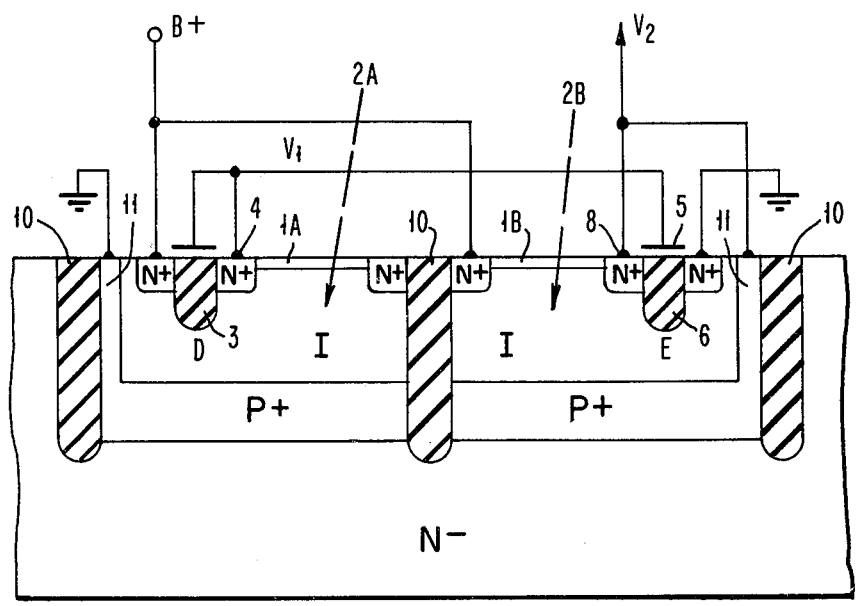
FIG. 10 is a solid state illustration of the circuit of FIG. 4.

The push-pull arrangement of FIG. 4 may be fabricated in a monolithic structure as shown in FIG. 10 wherein the same reference numerals are employed. A deep trench 10 is provided for isolation.

The structure is formed starting, for example, with an N− silicon substrate. An epitaxial P+ layer is grown followed thereafter by an intrinsic layer I. A deep trench in the form of a closed horizontal configuration surrounding each device segment is provided with the cross-sectional elements thereof shown as elements 10.

The trench is back filled with $SiO_2$ or other suitable insulating material to form the isolation. There is next implanted an N+ region for each source/drain and PIN diode, and the N+ contact regions. This is followed by a phosphorus implant forming the depletion mode device D and a boron implant forming the enhancement mode device E. A suitable contact 11 to the P+ region can be accomplished by a standard "reach through" diffusion at a designated area using boron.

The N+ source/drain region and the shallow N+ PIN contact region can be processed in the same step if the source/drain regions are shallow enough for the purpose of photodiode.

What has been described is an optical signal processing circuit wherein the circuit elements and interarrangement are integratable and provides selectable bistability, power gain and impedance matching capabilities.

Having thus described our invention, what we claim as new and desire to secure by Letters Patent is:

1. In a circuit of the type wherein a digital electrical signal is delivered in response to a change in light intensity, the improvement comprising a first and a second stage connected between a reference potential and a power source potential, said first stage including a photosensitive member connected in series with a load between said reference potential and said power source potential providing across said photosensitive member in the presence of light a difference in potential with respect to said reference potential, said second stage including an enhancement mode field effect transistor having the source electrode thereof connected to said reference potential and the drain thereof connected in series with a load to said power source potential, means applying said difference of potential across said photosensitive member to the gate electrode of said enhancement mode field effect transistor in said second stage, and output signal means delivering an output signal appearing at the drain electrode of said enhancement mode field effect transistor in said second stage.

2. The circuit of claim 1 wherein the load in said second stage is a second photosensitive member.

3. The circuit of claim 1 wherein the load in said first stage is a depletion mode field effect transistor.

4. The circuit of claim 1 wherein the load in said second stage is a depletion mode field effect transistor.

5. The circuit of claim 1 wherein the load in each said first and said second stage is a depletion mode field effect transistor.

6. The circuit of claim 2 wherein the load in each said first and said second stage is a depletion mode field effect transistor.

7. The circuit of claim 1 wherein said photosensitive member is a photoconductor.

8. The circuit of claim 1 wherein said photosensitive member is a phototransistor.

9. The circuit of claim 1 wherein said photosensitive member is a PIN diode.

10. The circuit of claim 2 wherein said photosensitive member is a photoconductor.

11. The circuit of claim 2 wherein said photosensitive member is a phototransistor.

12. The circuit of claim 2 wherein said photosensitive member is a PIN diode.

* * * * *